United States Patent [19]

Heybruck

[11] Patent Number: 5,488,612
[45] Date of Patent: Jan. 30, 1996

[54] METHOD AND APPARATUS FOR FIELD TESTING FIELD PROGRAMMABLE LOGIC ARRAYS

[75] Inventor: William F. Heybruck, Charlotte, N.C.

[73] Assignee: International Business Machines, Corporation, Armonk, N.Y.

[21] Appl. No.: 131,070

[22] Filed: Oct. 4, 1993

[51] Int. Cl.[6] .................................................. G06F 11/00
[52] U.S. Cl. ........................... 371/22.2; 371/22.1
[58] Field of Search .................. 371/22.2, 22.4, 371/21.2, 15.1, 21.3, 27, 22.5, 22.3; 324/73.1; 365/189.08

[56] References Cited

U.S. PATENT DOCUMENTS

| | | | |
|---|---|---|---|
| 4,635,261 | 1/1987 | Anderson et al. | 371/22.4 |
| 4,672,610 | 6/1987 | Salick . | |
| 4,768,196 | 10/1986 | Joe et al. . | |
| 4,879,688 | 11/1989 | Turner et al. . | |
| 4,893,311 | 1/1990 | Hunter et al. . | |
| 4,918,378 | 4/1990 | Katricioglu et al. | 371/21.2 |
| 4,937,864 | 6/1990 | Caseiras et al. . | |
| 4,958,346 | 9/1990 | Fujisaki | 371/21.3 |
| 4,998,250 | 3/0591 | Kohlmeier et al. | 371/15.1 |
| 5,006,787 | 4/1991 | Katircioglu et al. | 324/73.1 |
| 5,017,809 | 5/1991 | Turner . | |
| 5,042,034 | 8/1991 | Correale, Jr. et al. . | |
| 5,091,908 | 2/1992 | Zorian . | |
| 5,105,388 | 4/1992 | Itano et al. | 365/189.08 |
| 5,285,453 | 2/1994 | Gruodis | 371/27 |

FOREIGN PATENT DOCUMENTS 0361525  9/1989  European Pat. Off. .

Primary Examiner—Emanuel T. Voeltz
Assistant Examiner—Edward Pipala
Attorney, Agent, or Firm—Richard M. Goldman

[57] ABSTRACT

Disclosed are methods and apparatus for a testing a field programmable logic gate array. In the method the non-volatile gates are set to a testable setting. The programmable logic array is then configured into (1) a pseudo random pattern generator, (2) a multiple input signature register, (3) a signature comparator, and (4) AND-plane and OR-plane logic array areas. A pseudo random set of test pattern vectors is applied to the programmable logic array from the pseudo random pattern generator. The output is captured in the multiple input signature register and compared in the comparator. Finally, individual non-volatile floating gate field effect transistors are selectively set to provide the desired set of sums of products.

2 Claims, 4 Drawing Sheets

METHOD AND APPARATUS FOR FIELD TESTING FIELD PROGRAMMABLE LOGIC ARRAYS

FIELD OF THE INVENTION

This invention relates to field programmable logic arrays, and more particularly to field testing field programmable logic arrays. Logic arrays are characterized by a "sea of gates," that is, by an AND plane and an OR plane. The AND plane-OR plane "sea of gates" takes an input vector and produces a "sum of products" output of the input vector components. In a programmable logic array the ANDs in the AND plane and the ORs in the OR plane are settable, for example, by setting non-volatile floating gate field effect transistors, to thereby produce desired operations on selected bits of the input vectors. In a field programmable logic array the setting of the non-volatile floating gate field effect transistors may be accomplished without removing the programmable logic array from its environment.

According to the invention the non-volatile gates are set to a testable setting. The programmable logic array is then configured into (1) a pseudo random pattern generator, (2) a multiple input signature register, (3) a signature comparator, and (4) AND-plane and OR-plane logic array areas. A pseudo random set of test pattern vectors is applied to the programmable logic array from the pseudo random pattern generator. The output is captured in the multiple input signature register and compared in the signature comparator. Finally, individual non-volatile floating gate field effect transistors are selectively set to provide the desired set of sums of products. The method of the invention can be analogized to setting the programmable logic array to a "blank sheet of paper" state and thereafter testing the now blank "sheet of paper" to verify that it is, in fact, actually a "blank sheet" with fully erased non-volatile gates.

BACKGROUND OF THE INVENTION

Programmable logic arrays are capable of being programmed and subsequently reprogrammed to recover particular functions and operations. The programming and reprogramming is typically carried out by removing the device or even the complete package containing the device, and reprogramming the device. This has typically been done in an EPROM Programmer at a service facility, and is not done as a user capable task.

Attempts to accomplish user programmability are described, for example in U.S. Pat. Nos. 4,879,688, 4,937,864, 5,017,809, and 5,105,388, and in European Patent 361525.

U.S. Pat. No. 4,879,688 to Turner and Rutledge for *In-System Programmable Logic Device* describes a programmable logic device that is field programmable and configuarble, but without testing or verification of successful field programming.

U.S. Pat. No. 4,937,864 to Caseiras, Filion, and Evanitsky for *Debug Routine Accessing System* describes debugging routines stored on floppy disks to unlock different debugging routines.

U.S. Pat. No. 5,017,809 to Turner for *Method and Apparatus for Program Verification of A Field Programmable Logic Device* describes verification of the programmed device, but not the condition of individual cells.

U.S. Pat. No. 5,105,388 Itano and Shimbayashi for *Programmable Logic Device Including Verify Circuit for Macro-Cell* describe a programmable memory with output and feedback.

U.S. Pat. Nos. 4,672,610 to John E. Salick for *Built In Self Test Input Generator for Programmable Logic Arrays*, 4,768,196 to Jou for *Programmable Logic Array*, 4,893,311 to Craig E. Hunter et al. for *CMOS Implementation of A Built In Self Test Input Generator (BISTIG)*, and 5,091,908 to Zorian for *Built In Self Test Technique for Read-Only Memories*, as well as Japanese laid open Patent Application 2-083676 (laid open Mar. 23, 1990, Application Ser. No. 2-3591988 filed Sep. 20, 1988) of Akao et al for *Semiconductor Integrated Circuit for Data Processing* all describe various programmable logic circuits with built in self testing capability.

However, these documents all fail to provide a combination of pre-programming and post-programming built in self testing. They do not provide the capability of testing the underlying circuit itself for defects which may not have been evident with the prior program but which can cripple the subsequent program. This is especially true of defects which may arise on erasing a previous program.

Thus, a clear need exists for a field programmable logic array having built in self test capabilities for testing the underlying circuit itself for defects which may not have been evident with the prior program but which can cripple the subsequent program.

OBJECTS OF THE INVENTION

It is a primary object of the invention provide a built in self test capability for a field programmable logic array.

It is a further object of the invention to provide built in self test capability for a field programmable logic array that has the capability of self testing the underlying circuit itself for defects which may not have been evident with the prior program but which can cripple the subsequent program.

SUMMARY OF THE INVENTION

These and other objects of the inventions are attained by the method and apparatus of the invention. The built in self tester of the invention has the capability of self testing the underlying circuit itself for defects which may not have been evident with the prior program but which can cripple the subsequent program. Moreover, the built in self tester of the invention can also readily test the programmed logic array.

According to one embodiment of the invention there is provided a self-testable, field programmable gate array which extends beyond the field programmable gate arrays shown in FIGS. 1, 2, 3, and 4. The "sum of products" (NOR-NOR) logic of the field programmable gate array resides in a programmable logic gate array "sea of gates" 11. This "sea of gates" 11 has an AND-plane 21 and an OR-plane 31. Each field programmable gate 41 in FIG. 4 has a non-volatile floating gate field effect transistor 43 in series with a volatile field effect transistor 45. Programmability is provided by the non-volatile floating gate field effect transistor 43. The non-volatile floating gate field effect transistors 43 can have their individual states selectively changed to program the gate array 11.

According to the invention built in self testing is provided through the combination of the programmable "sea of gates" 11 with a pseudo random pattern generator 61, a multiple input signature register 71, and a comparator 81. The pseudo random pattern generator 61 applies a pseudo random set of test patterns, i.e., test vectors, to the programmable logic gate array 10 sea of gates 11. The multiple input signature register 71 captures the output of the programmable logic gate array sea of gates 11. This captured output is with respect to test patterns generated by the pseudo random pattern generator 61. The comparator 81 compares the input pseudo random set of test patterns received by the sea of gates 11 to the output of the sea of gates 11 received by the multiple input signature register 71.

In a preferred embodiment of the invention a built-in self-testable, field programmable gate array 10 is provided where the gate array 10 is programmably divisible into the four logical areas enumerated above, i.e., the programmable AND plane 21—OR plane 31 "sea of gates" 11, the pseudo random pattern generator 61, the multiple input signature register 71, and the comparator 81.

The field programmable gate array 11 is programmed by setting the non-volatile floating gate field effect transistors 43 to predetermined states for reprogramming. The logic array 10 is then programmably divided into (1) a pseudo random pattern generator 61, (2) a multiple input signature register 71, (3) a signature comparator 81, and (4) an AND-plane 21, OR-plane 31 logic array 11. A pseudo random set of test patterns is applied to the AND plane-OR plane logic array 11 from the pseudo random pattern generator 61. The output of the AND plane—OR plane logic array 11 is captured in the multiple input signature register 71, and compared, in the comparator 81. After verifying the operability of the gates in the logic array 11 selected ones of the non-volatile gates 43 are set high and/or low to provide the desired sets of sums of products.

The logic array 10 can be reprogrammed by downloading from a floppy disk, a CD-ROM, a tape drive, a hard drive, or in a PROM programmer, or over a LAN or a wide area network.

THE FIGURES

The invention may be understood by reference to the FIGURES.

DETAILED DESCRIPTION OF THE INVENTION

METHOD OF THE INVENTION

Figure 1:
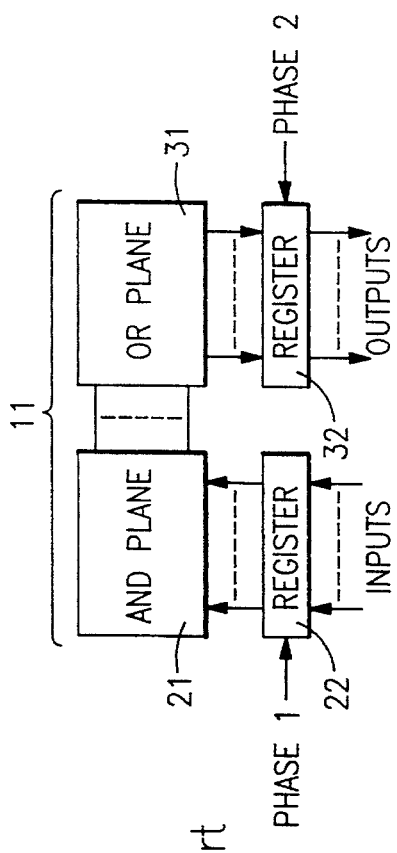
FIG. 1 (Prior Art) is a general overview of the AND and OR planes of a programmable gate array.

A preferred embodiment of the invention provides a method of field programming a built-in self testable, field programmable logic array 10. The field programmable logic array 10 has a programmable logic gate array sea of gates 11 having an AND-plane 21 and an OR-plane 31. Each gate in the AND-plane 21 OR-plane 31 "sea of gates" 11 has a non-volatile floating gate field effect transistor 43 in series with a field effect transistor 45. The individual non-volatile, floating gate, field effect transistors 43 provide the programmability and reprogrammability of the gate array 10.

The method of the invention is described with respect to a previously programmed gate array. The program in the previously programmed gate array is removed by setting the non-volatile, floating gate, field effect transistors 43 to zero.

A floating gate setting pulse pattern or vector is then applied to the logic array 10. This pulse pattern or vector has a set voltage and a reset voltage. The purpose of the pulse pattern or vector is to configure the logic gate array 10 into (1) the pseudo random pattern generator 61, (2) the multiple input signature register 71, (3) the signature comparator 81, and (4) the AND-plane 21, OR-plane 31 logic array areas.

The array 10 is then tested by applying a pseudo random set of test patterns from the pseudo random pattern generator 61 to the programmable logic gate array 10 AND-plane 21, and OR-plane 31 sea of gates. The corresponding output is captured in the multiple input signature register 71. This output of the programmable logic gate array sea of gates 11 with respect to test patterns generated by the pseudo random pattern generator 61 means is temporarily stored in the multiple input signature register 71 for comparison with the Pseudo Random Pattern Generator input in the comparator 81.

The comparison in the comparator 81 is between the input pseudo random set of test patterns received by the sea of gates 11 and the sea of gates 11 output received from the sea of gates 11 by the multiple input signature register means 71. After successful testing selected ones of the non-volatile floating gate field effect transistors 43 are set to 0's and 1's as appropriate to provide the desired "sum of products" output.

BUILT IN SELF TESTABLE PROGRAMMABLE GATE ARRAY SYSTEM OF THE INVENTION

The method of the invention can be practiced in a system having a self-testable, field programmable gate array 11 with AND-plane 21 OR-plane 31 functionality, pseudo random number generator 61 functionality, multiple input signature storage register 71 functionality, a comparator 81, and circuitry to supply the electrical energy needed for setting and resetting non-volatile floating gate field transistors 43 used for programmability.

Figure 3:
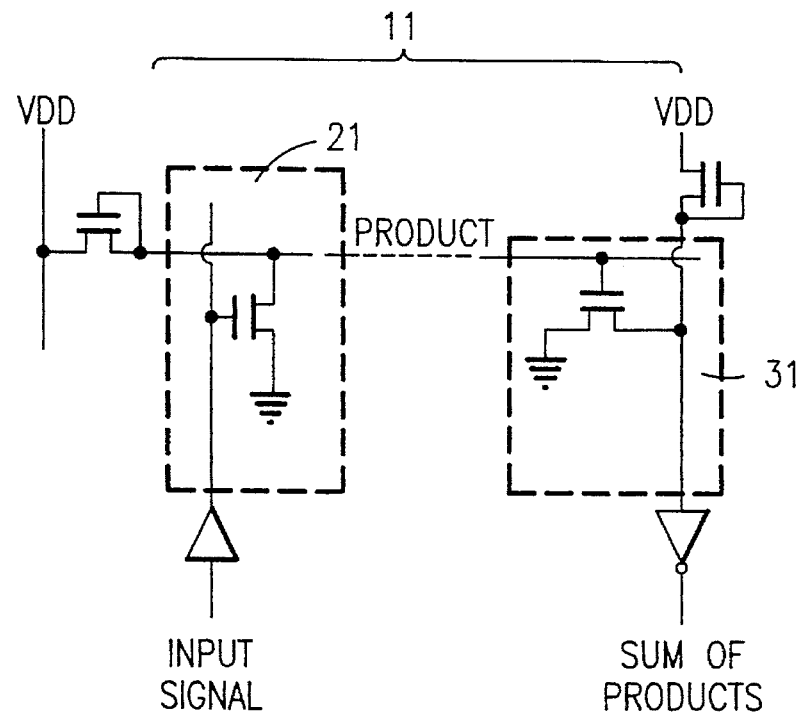
FIG. 3 (Prior Art) shows individual cells of the AND and OR planes of a programmable gate array, including the pull up transistors, inputs, buffers and inverted buffers, and outputs.
Figure 4:
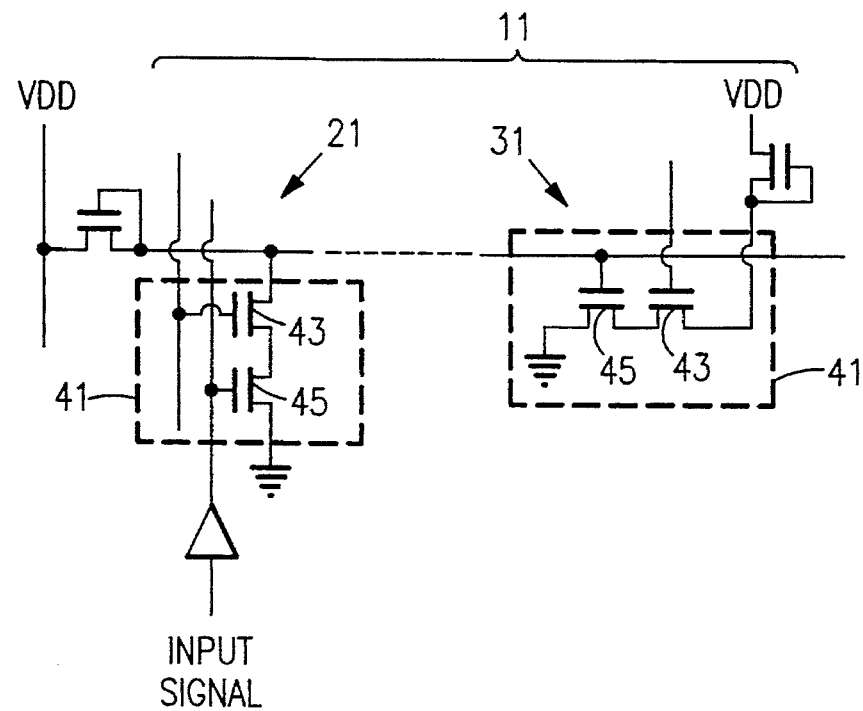
FIG. 4 (Prior Art) shows the devices of FIG. 3 with the addition of non-volatile, floating gate, field programmable field effect transistors.
Figure 5:
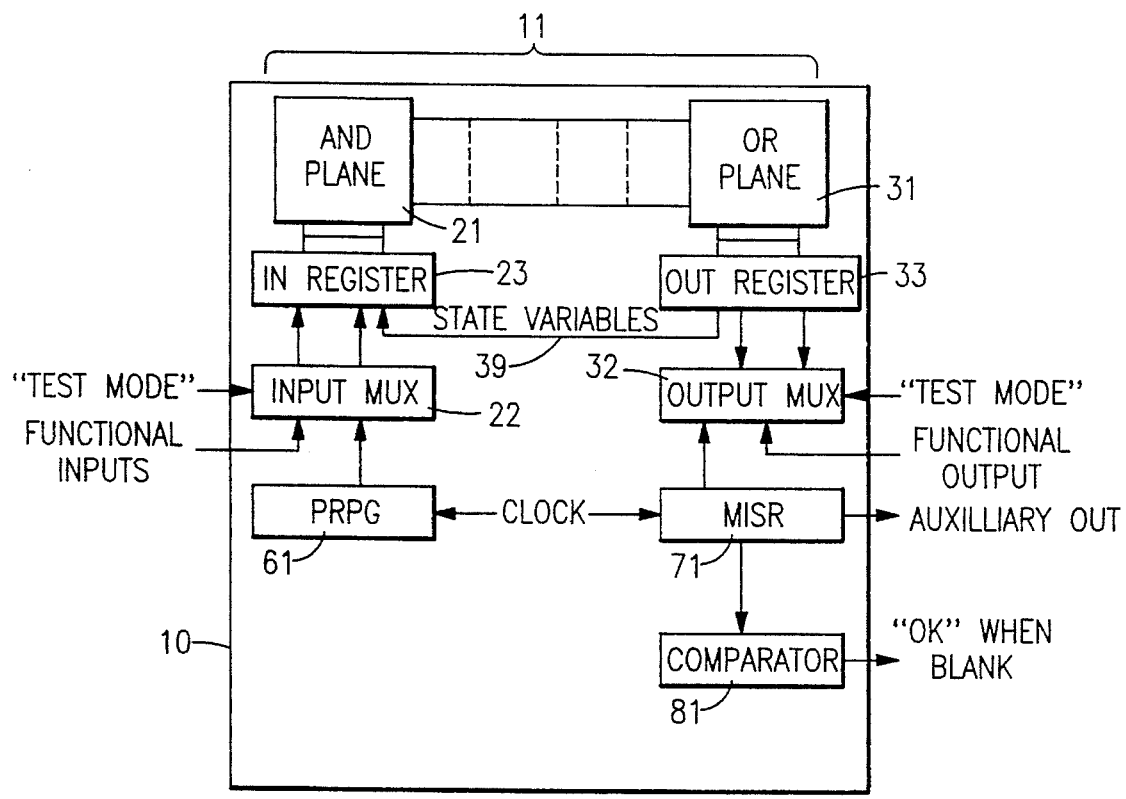
FIG. 5 shows a logic array of the invention, with registers, a pseudo random pattern generator, a multiple input signature register, and a comparator.

A suitable array system is shown in FIG. 5. This array system 10 has a programmable logic gate array sea of gates 11, shown FIGS. 1, 2, 3, and 4. The sea of gates 11 has an AND-plane 21 and an OR-plane 31. As shown in FIGS. 3 and 4 each individual logical gate in the sea of gates 11 has a non-volatile floating gate field effect transistor 43 in series with a conventional field effect transistor 45, e.g., an N-MOS field effect transistor.

The system has a subsystem for supplying the high energy train of pulses or vectors needed for selectively changing the state of selected non-volatile floating gate field effect transistors 43 to program the gate array 11. This can take the form of an internal circuit or an external circuit, for example an EEPROM programmer.

Figure 7:
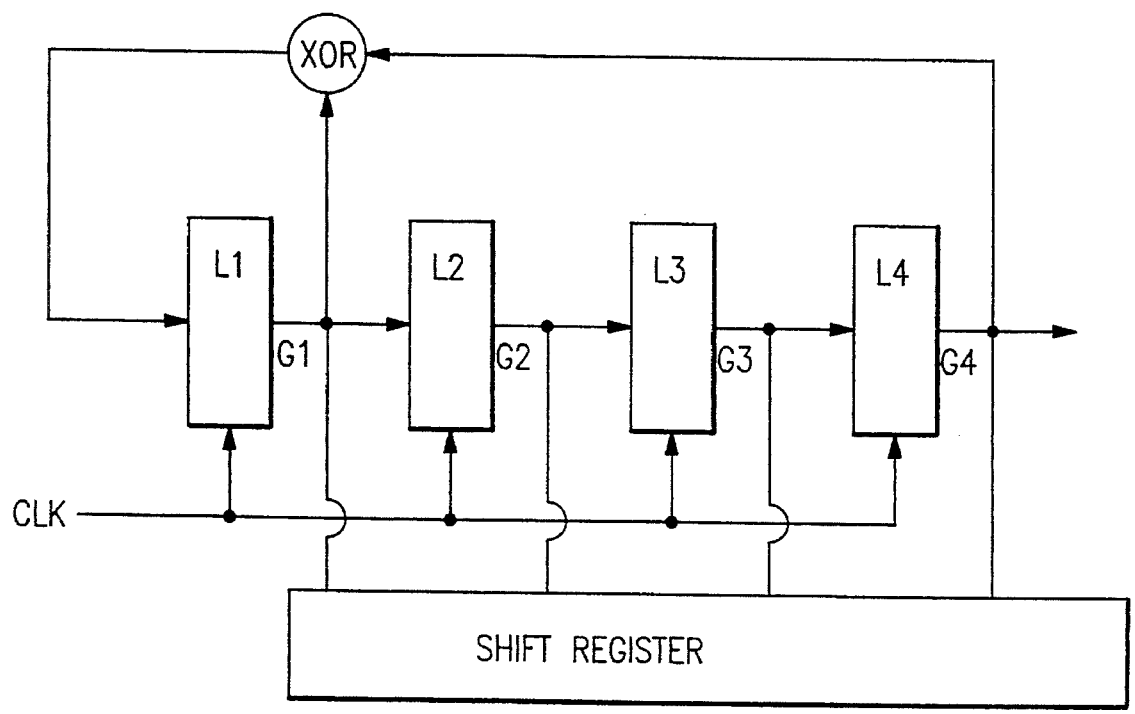
FIG. 7 shows four cells of the Pseudo Random Pattern Generator (PRPG) used in the invention.

The system further includes a pseudo random pattern generator (PRPG) 61. The pseudo random pattern generator (PRPG) 61 is shown in FIG. 7. The pseudo random pattern generator (PRPG) 61 applies a pseudo random set of test patterns or of vectors to the programmable logic gate array sea of gates 11.

Figure 8:
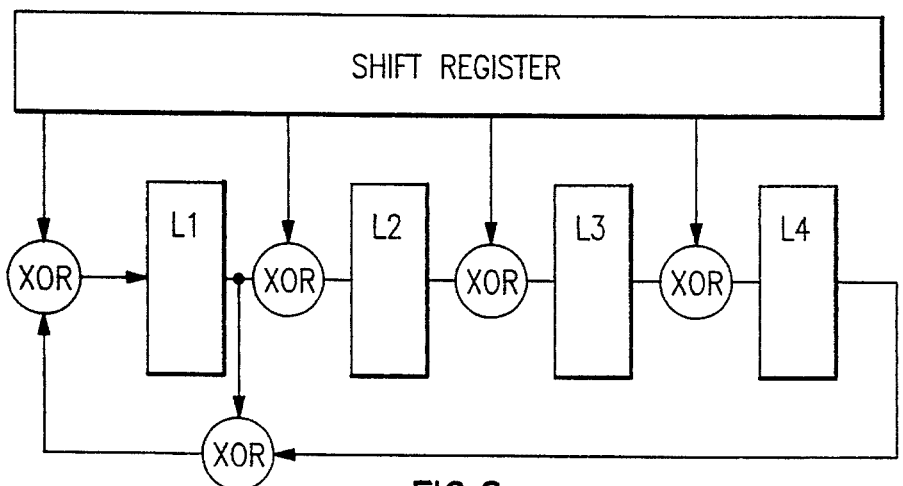
FIG. 8 shows fours cells of the Multiple Input Signature Register (MISR) used in the invention.

The output of the sea of gates 11 is then captured in a multiple input signature register (MISR) 71 shown with greater specificity in FIG. 8.

The system 10 further includes a comparator 81 to compare the input pseudo random set of test patterns received by the sea of gates 11 from the PRPG 61 and processed by the sea of gates 11 to the sea of gates 11 output received by the multiple input signature register (MISR) 71 from the sea of gates 11.

BUILT IN SELF TESTABLE, FIELD PROGRAMMABLE GATE ARRAY OF THE INVENTION

In a preferred embodiment of the invention a still higher degree of integration is attained. In this more highly integrated embodiment of the invention the built-in self-testable, field programmable gate array 10 has a subsystem for programming the floating gate field effect transistors by selectively changing the state of selected non-volatile floating gate field effect transistors 43 to program the gate array. In the preferred, highly integrated embodiment of the invention the gate array 10 itself is programmably divisible into four logical areas. These logical areas are a first logical area of the programmable logic gate array sea of gates 11 having an AND-plane 21 and an OR-plane, a second logical area for the pseudo random pattern generator 61 register, a third logical area for the multiple input signature register 71, and a fourth logical area for the comparator 81 that compares the input pseudo random set of test patterns received by the sea of gates 11 to the sea of gates 11 output received by the multiple input signature register 71 from the sea of gates 11.

In the particularly preferred, highly integrated embodiment of the invention, the four regions are on a single EPROM or EEPROM integrated circuit chip 10.

SEA OF GATES "AND" AND "OR" PLANES

The AND-plane 21 OR-plane 31 "sea of gates" 11 in FIGS. 1, 2, 3, and 4 implements combinational "Sum of Products" logic in form that can be readily reprogrammed. The inputs to the "sea of gates" 11 are stored in an Input Register 22 during a clock interval or clock pulse ϕ1. The input from the Input Register 22 runs vertically through logic in the AND-plane 21 matrix where the AND plane logic generates specific products of selected inputs and complemented inputs. The outputs of the AND-plane 21 matrix are logical products that leave the AND-plane 21 matrix at right angles and run through the OR-plane 31 matrix. The outputs of the OR-plane 31 matrix then run vertically through the OR-plane 31 to the Output Register 32, and are stored in the output register 32 until clocked out by clock signal or clock pulse ϕ2.

Figure 2:
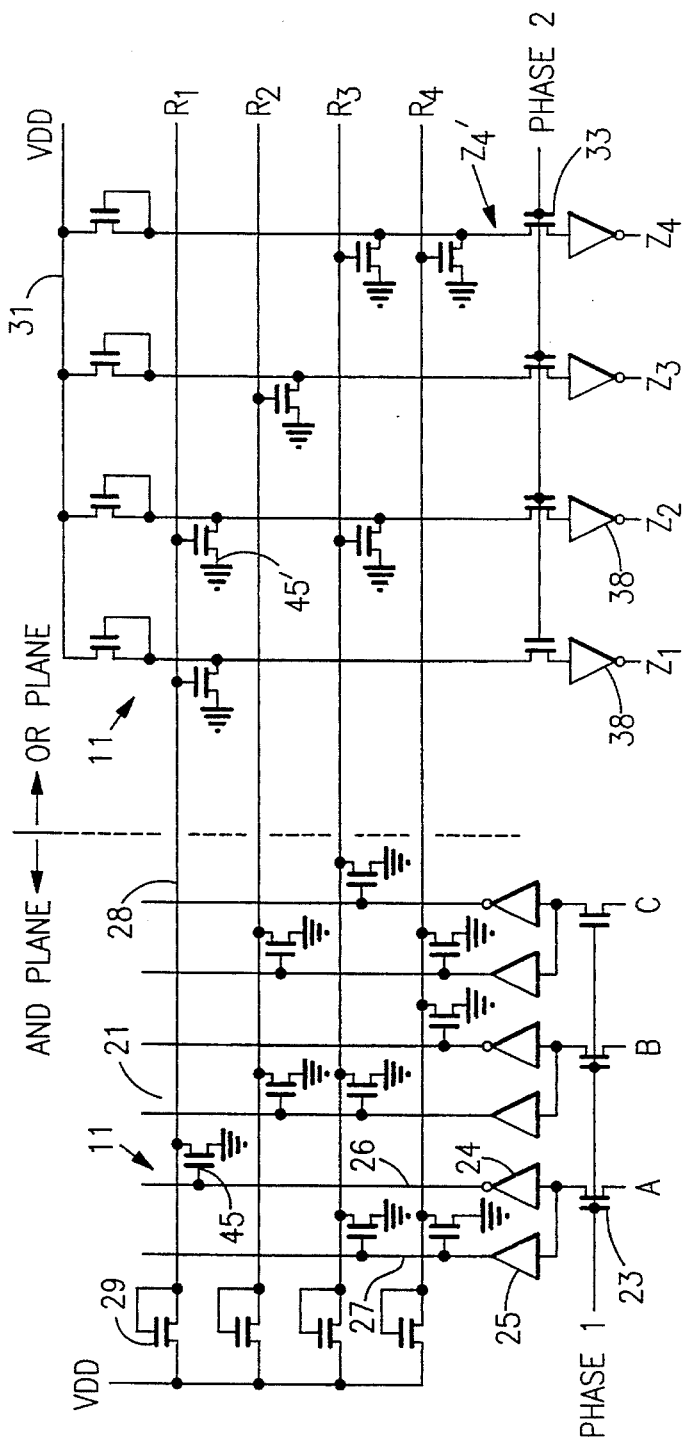
FIG. 2 (Prior Art) shows the arrangement of the logic transistors and pass transistors of the AND and OR planes of the programmable gate array of FIG. 1.

A simplified circuit of the "sea of gates" is shown in FIG. 2. The inputs A, B, and C are clocked into the AND-plane 21 by the pass transistors 23 on clock pulse ϕ1 to the inverting buffers 24 and non-inverting buffers 25. The buffers 24 and 25 each drive two lines 26 and 27 through the AND-plane 21, one for the input and one for the inverted or complemented input, as A and A', B and B', and C and C'.

The outputs 28 of the AND-plane 21 are formed by the horizontal lines 28 shown with pull-up transistors 29 at their left ends in FIGS. 2 and 3. The outputs of the AND plane 21 are the NOR'ed inputs thereto. That is $R_1 = (A')' = A,$
$R_2 = (B+C)' = B'C,$
$R_3 = (A+B+C)' = A'B'C,$ and
$R_4 = (A+B'+C)' = A'BC.$ The OR-plane 31 matrix is rotated 90 degrees with respect to the AND-plane 21 matrix. Each output 38 of the OR-plane 31 is the NOR'ed output of the inputs R1, R2, R3, and R4 to the OR-plane 31. These are inverted and go to the Output Register. Exemplary are:

$Z_1 = NOR(R_1) = (A)' \Rightarrow A,$
$Z_2 = NOR(R_1,R_3) = (A+A'B'C)' \Rightarrow A+A'B'C,$
$Z_3 = NOR(R_2) = (B'C)' \Rightarrow B'C,$ and
$Z_4 = NOR(R_3,R_4) = (A'B'C+A'BC)'' \Rightarrow A'B'C+A'BC.$ In a finite state machine it is necessary to know the current state of the machine, i.e., the current output, before proceeding to the next step. Thus, it is necessary in a finite state machine to feed some of the outputs of the OR-plane 31 back to the AND-plane 21 through the feedback paths 39. The feedback signals 39 carry the "state" of the machine, and the feedback signals plus the input are stored in the input register at time pulse ϕ1. The feedback signals plus the new inputs then propagate through the combinational logic 11.

The individual volatile MOSFET transistor 45 gates 41 of the "sea of gates" 11 are programmable to form the AND and OR gates by programming the non-volatile floating gate transistors 43 in series therewith. The resetting of these non-volatile floating gate transistors 43, the built in self testing of the volatile NMOS FET transistors 45, and the setting of the non-volatile floating gate field effect transistors 43 is carried out by the method and apparatus of the invention.

LINEAR FEEDBACK SHIFT REGISTER

A linear feedback shift register is incorporated in the pseudo random pattern generator 61 and a derivative of the linear feedback shift register is incorporated in the multiple input signature register 71.

Figure 6:
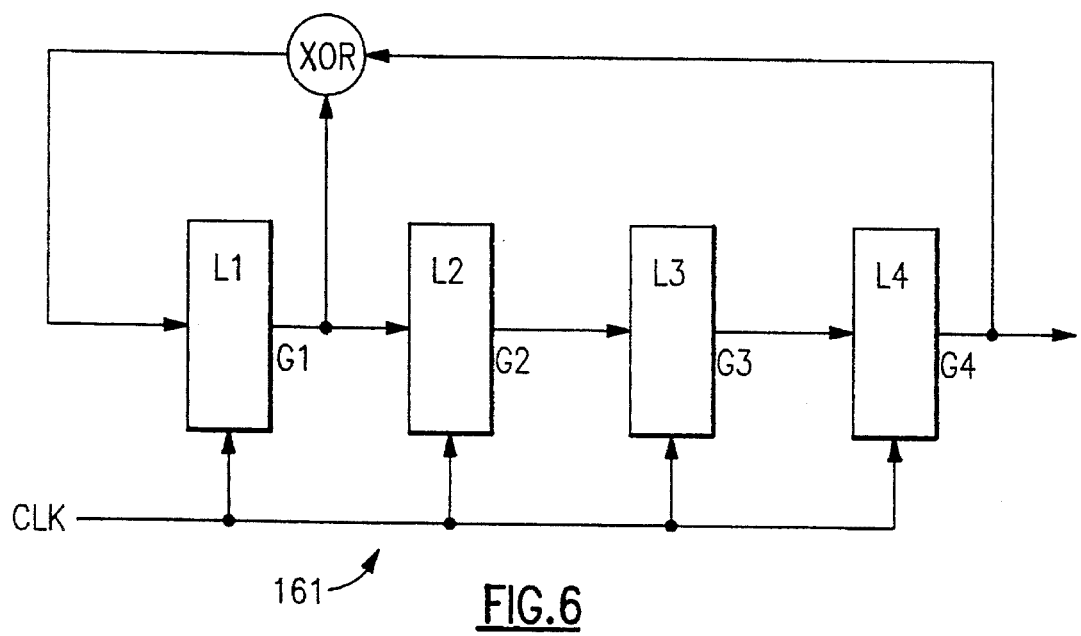
FIG. 6 shows four cells of a linear shift register representative of the Linear Shift Registers used in the Pseudo Random Pattern Generator (PRPG) and Multiple Input Signature Register (MISR) of the invention.

A four cell linear feedback shift register 161 is shown in FIG. 6. This is a four element linear feedback shift register, and is shown only for purposes of illustration and exemplification, the actual linear feedback shift registers used in the method and apparatus of the invention having sixteen or more memory elements, and even thirty-six or more memory elements.

The four cell linear feedback shift register 161 shown in FIG. 6 has four logical elements, e.g., memory elements, L1, L2, L3, and L4, with outputs Q1, Q2, Q3, and Q4. The outputs Q1 and Q4 are exclusive or'ed (EXOR'ed) to provide the input to memory element L1. The states of the Linear Feedback Shift Register are as shown in Table I, below:

TABLE I

STATES OF FOUR ELEMENT LINEAR FEEDBACK SHIFT REGISTER

| CYCLE | Q1 | Q2 | Q3 | Q4 |
|---|---|---|---|---|
| INITIAL | 1 | 0 | 0 | 0 |
| 1 | 1 | 1 | 0 | 0 |
| 2 | 1 | 1 | 1 | 0 |
| 3 | 1 | 1 | 1 | 1 |
| 4 | 0 | 1 | 1 | 1 |
| 5 | 1 | 0 | 1 | 1 |
| 6 | 0 | 1 | 0 | 1 |
| 7 | 1 | 0 | 1 | 0 |
| 8 | 1 | 1 | 0 | 1 |
| 9 | 0 | 1 | 1 | 0 |
| 10 | 0 | 0 | 1 | 1 |
| 11 | 1 | 0 | 0 | 1 |
| 12 | 0 | 1 | 0 | 0 |
| 13 | 0 | 0 | 1 | 0 |
| 14 | 0 | 0 | 0 | 1 |
| REPEAT | 1 | 0 | 0 | 0 |

PSEUDO RANDOM PATTERN GENERATOR (PRPG)

The Pseudo-Random Pattern Generator 61 (PRPG) is a Linear Feedback Shift Register having sufficient cells to be multiplexed into the Input Register 23 for providing a pseudo random pattern or vector thereto. The Pseudo-Random Pattern Generator 61 shown in FIG. 7 has four elements. The shift register 23 receiving the output of the PRPG 61 is the Input Register 21 of the sea of gates 11 in FIGS. 1, 2, 3, and 4.

MULTIPLE INPUT SIGNATURE REGISTER (MISR)

The Multiple Input Signature Register 71 (MISR) of FIGS. 5 and 8 takes the multiplexed output of the Output Register 33 and transfers it to the Comparator 81. A Multiple Input Signature Register 71 is shown in FIG. 8 for purposes of illustration. While only four elements are shown, a typical Multiple Input Signature Register 71 useful in the built in self testable field programmable gate array of the invention may have from about sixteen to thirty four or more elements. The pattern of elements and EXOR gates is shown in FIG. 8. The specific logic in the logic elements, $L_1$, $L_2$, $L_3$, and $L_4$, depends on the logical structures contemplated for the "sea of gates" 11, and will always be such to return the contents of the Pseudo Random Pattern Generator (PRPG) 61 if there are no faults in the "sea of gates" 11.

SIGNATURE COMPARATOR

The signature comparator 81 compares the output of the Multiple Input Signature Register 71 with the input from the Pseudo Random Pattern Generator 61. The output of the comparator 81 is a string of zero's for a successful test.

INTEGRATED SYSTEM

An integrated system is shown in FIG. 5. The integrated system has the AND-plane 21, OR-plane 31 "sea of gates" 11. The input to the "sea of gates" 11 is through a clocked input register 23 which inputs its contents to the "sea of gates" 11 buffers 25 and inverted buffers 24, as appropriate, on the clock pulse $\phi 1$. The inputs to the input register 23 can be either a multiplexed input or state variables from the output register 33 of the "sea of gates" 11. The input multiplexer 22 is switched by a TEST MODE signal between functional inputs and the outputs of the Pseudo Random Pattern Generator 61.

The output of the OR-plane 31 of the "sea of gates" 11 is clocked into the output register by clock pulse $\phi 2$, and then to the output multiplexer 32. The TEST MODE signal switches the multiplexer 32 between functional outputs and test outputs to the Multiple Input Signature Register 71. The Multiple Input Signature Register 71 has an AUX output that is an optional signal that can be used to retrieve the signature of a programmed device, such that the PRPG 61 and the MISR 71 can be used to test devices after non-volatile programming.

The OK output of the comparator 81 is the single line indicator of the successful test of a blank device, i.e., an unprogrammed device or a device that is programmed to a predetermined pattern such that the comparator 81 holds the correct answer which is compared to the MISR when the test is complete.

While the invention has been described with respect to certain preferred embodiments and exemplifications, it is not intended to limit the scope of the invention thereby, but solely by the claims appended hereto.

I claim:

1. A self-testable, field programmable gate array having a plurality of individual gates, each of said gates comprising a non-volatile floating gate field effect transistor logically in series with a volatile field effect transistor, said gate array comprising means for selectively changing the state of selected non-volatile floating gate field effect transistors to program the gate array; said gate array being programmably divisible into four logical areas, said areas comprising:

a. a first logical area comprising a programmable logic gate array sea of gates having an AND-plane and an OR-plane;

b. a second logical area comprising pseudo random pattern generator register means to apply a pseudo random set of test patterns to the programmable logic gate array sea of gates;

c. a third logical area comprising multiple input signature register means to capture the output of the programmable logic gate array sea of gates with respect to test patterns generated by the pseudo random pattern generator means; and d. a fourth logical area comprising comparator means to compare the input pseudo random set of test patterns received by the sea of gates to the sea of gates output received by the multiple input signature register means from the sea of gates.

2. A method of field programming a self testable, field programmable logic array having a programmable logic gate array sea of gates having an AND-plane and an OR-plane, each gate comprising a non-volatile floating gate field effect transistor in series with a field effect transistor, said method comprising the steps of:

a. setting said non-volatile gates to zero;

b. configuring the logic array into (1) pseudo random pattern generator, (2) multiple input signature register, (3) signature comparator, and (4) AND-plane, OR-plane logic array areas;

c. applying a pseudo random set of test patterns from the pseudo random pattern generator to the programmable logic gate array AND-plane, OR-plane sea of gates;

d. capturing in the multiple input signature register means the output of the programmable logic gate array sea of gates with respect to test patterns generated by the pseudo random pattern generator means;

e. comparing, in the comparator means,
 i. the input pseudo random set of test patterns received by the sea of gates to
 ii. the sea of gates output received from the sea of gates by the multiple input signature register means; and f. thereafter selectively setting selected ones of said non-volatile gates to zero or one as appropriate.

* * * * *